(12) United States Patent
Pan et al.

(10) Patent No.: US 8,471,064 B2
(45) Date of Patent: Jun. 25, 2013

(54) COPOLYMERS OF INDENOFLUORENE AND THIOPHENE

(75) Inventors: Junyou Pan, Frankfurt (DE); Frank Meyer, Winchester (GB); Aurélie Ludemann, Frankfurt (DE); Arne Buesing, Frankfurt am Main (DE)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 12/374,363

(22) PCT Filed: Jun. 28, 2007

(86) PCT No.: PCT/EP2007/005721
§ 371 (c)(1),
(2), (4) Date: Jan. 19, 2009

(87) PCT Pub. No.: WO2008/009343
PCT Pub. Date: Jan. 24, 2008

(65) Prior Publication Data
US 2009/0247728 A1 Oct. 1, 2009

(30) Foreign Application Priority Data
Jul. 21, 2006 (EP) .................................. 06015193

(51) Int. Cl.
*C07C 211/00* (2006.01)

(52) U.S. Cl.
USPC ...... 564/426; 428/690; 528/380; 252/301.16; 549/331; 549/349; 549/41; 549/456; 549/160

(58) Field of Classification Search
USPC ...... 528/380; 428/690; 252/301.16; 548/418; 549/331, 349, 41, 456, 46, 460; 564/426; 568/14, 8
See application file for complete search history.

(56) References Cited

U.S. PATENT DOCUMENTS

| | | | |
|---|---|---|---|
| 7,247,761 B2 | 7/2007 | Falcou et al. | |
| 2004/0230021 A1* | 11/2004 | Giles et al. | 528/4 |
| 2005/0040757 A1 | 2/2005 | Chen et al. | |
| 2005/0075478 A1* | 4/2005 | Yamamoto et al. | 528/373 |
| 2006/0023894 A1 | 2/2006 | Sferrazza et al. | |
| 2006/0063033 A1 | 3/2006 | Sohn et al. | |
| 2006/0229427 A1 | 10/2006 | Becker et al. | |

FOREIGN PATENT DOCUMENTS

| | | |
|---|---|---|
| EP | 1279689 A2 | 1/2003 |
| EP | 1279691 A1 | 1/2003 |
| EP | 1284276 A1 | 2/2003 |
| EP | 1398336 A1 | 3/2004 |

(Continued)

OTHER PUBLICATIONS

Dyreklev et al., "Polymeric Field Effect Transistors Using Oriented Polymers", *Synthetic Metals*, vol. 55-57, pp. 4093-4098 (1993).

(Continued)

*Primary Examiner* — Shane Fang
(74) *Attorney, Agent, or Firm* — Novak Druce Connolly Bove + Quigg LLP

(57) ABSTRACT

The invention relates to novel copolymers comprising indenofluorene units and units of thiophene or its derivatives, to organic semiconductor (OSC) materials and organic electroluminescent materials comprising the copolymers, to the use of the copolymers and materials in electronic, electroluminescent or electrooptical devices, and to devices comprising the copolymers or materials.

10 Claims, 1 Drawing Sheet

FOREIGN PATENT DOCUMENTS

| | | | |
|---|---|---|---|
| EP | 1411563 | A2 | 4/2004 |
| EP | 1439590 | A2 | 7/2004 |
| EP | 1477504 | A1 | 11/2004 |
| EP | 1491568 | A1 | 12/2004 |
| EP | 1510535 | A1 | 3/2005 |
| WO | WO-99/54385 | A1 | 10/1999 |
| WO | WO-00/53656 | A1 | 9/2000 |
| WO | WO-03/007399 | | 1/2003 |
| WO | WO-03/052841 | A1 | 6/2003 |
| WO | WO-2004/022626 | A1 | 3/2004 |
| WO | WO-2004/041901 | A1 | 5/2004 |
| WO | WO 2004041901 | A1 * | 5/2004 |
| WO | WO-2004/084260 | A2 | 9/2004 |
| WO | WO-2005/014688 | A2 | 2/2005 |
| WO | WO-2005/014691 | A2 | 2/2005 |
| WO | WO-2005/023894 | A2 | 3/2005 |
| WO | WO-2005/055248 | A2 | 6/2005 |

OTHER PUBLICATIONS

Sonar et al., "4-Hexylbithieno[3,2-b:2'3'-e]pyridine: An Efficient Electron-Accepting Unit in Fluorene and Indenofluorene Copolymers for Light-Emitting Devices", *Macromolecules,* vol. 37, pp. 709-715 (2004).

* cited by examiner

COPOLYMERS OF INDENOFLUORENE AND THIOPHENE

RELATED APPLICATIONS

This application is a national stage application (under 35 U.S.C. §371) of PCT/EP2007/005721, filed Jun. 28, 2007, which claims benefit of European Application No. 06015193.3, filed Jul. 21, 2006.

FIELD OF THE INVENTION

The invention relates to novel copolymers comprising indenofluorene units and units of thiophene or its derivatives. The invention further relates to organic semiconductor (OSC) materials and organic electroluminescent (OEL) materials comprising the copolymers, the use of the copolymers and materials in electronic, electroluminescent or electrooptical devices, and devices comprising the copolymers or materials.

BACKGROUND AND PRIOR ART

In recent years, there has been development of organic semiconducting (OSC) materials in order to produce more versatile, lower cost electronic devices. Such materials find application in a wide range of devices or apparatus, including organic field effect transistors (OFETs), organic light emitting diodes (OLEDs), photodetectors, photovoltaic (PV) cells, sensors, memory elements and logic circuits to name just a few. The organic semiconducting materials are typically present in the electronic device in the form of a thin layer, for example less than 1 micron thick.

In the case of OFETs, the performance of the device is principally based upon the charge carrier mobility of the semiconducting material and the current on/off ratio, so the ideal semiconductor should have a low conductivity in the off state, combined with a high charge carrier mobility ($>1\times10^{-3}$ $cm^2$ $V^{-1}$ $s^{-1}$). In addition, it is important that the semiconducting material is relatively stable to oxidation i.e. it has a high ionisation potential, as oxidation leads to reduced device performance. Further requirements for the semiconducting material are a good processability, especially for large-scale production of thin layers and desired patterns, and high stability, film uniformity and integrity of the organic semiconductor layer.

In prior art various materials have been proposed for use as organic semiconductors in OFETs, including small molecules like for example pentacene, and polymers like for example polyhexylthiophene. However, the materials and devices investigated so far do still have several drawbacks, and their properties, especially the processability, charge-carrier mobility, on/off ratio and stability do still leave room for further improvement.

Such charge transport materials also find important application in OLEDs. For example, WO2004/084260 describes a hole transporting layer that is introduced between the anode and the emissive layer in a polymer OLED as interlayer. Such an interlayer can significantly improve the performance, especially the lifetime of the OLEDs. For optimum performance of such an OLED device, a high charge carrier mobility and appropriate energy alignment between interlayer, anode and emissive layer are required. In WO2004/084260, polymers based on triarylamine are suggested for use as interlayer. However, these polymers have the disadvantage that the energy level of the highest occupied molecular orbital cannot be adjusted in range that is sufficiently wide to fit the different emissive polymers used in the emissive layer, because the HOMO (highest occupied molecular orbital) of such polymers is mainly determined by the triarylamine unit.

One aim of the present invention is to provide new organic semiconducting materials for use in electronic devices, especially for use as active materials in OFETs or interlayers in light emitting devices, which have advantageous properties, in particular good processability, high charge-carrier mobility, high on/off ratio in case of OFETs, high oxidative stability and long lifetime in electronic devices. Another aim is to extend the pool of semiconducting materials available to the expert. Other aims of the present invention are immediately evident to the expert from the following detailed description.

It has been found that these aims can be achieved by providing semiconducting materials as claimed in the present invention. These materials are based on copolymers comprising one or more tetrasubstituted cis- or trans-indenofluorene units or derivatives thereof

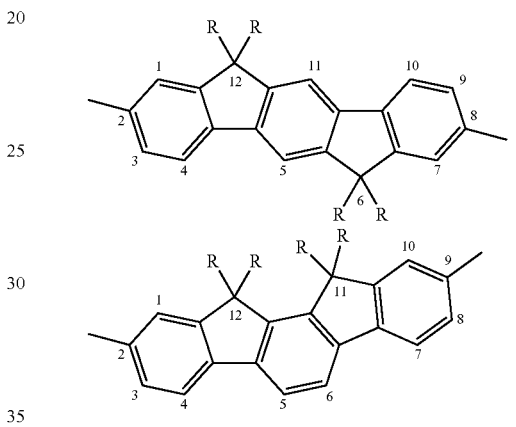

wherein R denotes aromatic or aliphatic hydrocarbyl groups, and two adjacent groups R may also form a spiro group with the respective fluorene group to which they are attached, and further comprising one or more thiophene or selenophene unit.

In particular, it has been found that such copolymers are suitable for use as semiconducting materials in electronic devices like transistors and OLEDs, as they have good processibility and at the same time show a surprisingly high charge carrier mobility and high oxidative stability.

WO 2004/041901 describes polymers comprising aryl-substituted indenofluorenes and further units like triarylamine or heteroaryl moieties, and their use in OLED or OFET devices. Surin et al., *Adv.Funct.Mat.* 2005, 15, 1426-1434 disclose copolymers of 6,6-12,12-tetraoctyl trans-indenofluorene and dithiophene, terthiophene or quaterthiophene units that are optionally alkylated. Sonar et al., *Macromolecules* 2004, 37, 709-715 discloses copolymers of 6,6-12,12-tetraoctyl trans-indenofluorene and 4-hexyldithieno[3,2-b:2', 3'-e]pyridine. However, copolymers as claimed in the present invention are not disclosed.

Thiophenes have good hole transport ability. However, they have only moderate solubility in many organic solvents, which does negatively affect their processability in a film-forming process and leads to films with moderate uniformity. Indenofluorenes, on the other hand, are soluble in conventional organic solvents and thus show good processability, enabling the formation of films with high uniformity. However, they have been mainly suggested to be efficient electron transporting and light-emitting moieties. It was therefore surprising that a copolymer according to the present invention, wherein indenofluorene units are combined with hole transporting moieties like thiophenes, shows high charge carrier mobility and enables the preparation of electronic devices like transistors with high on/off ratios and OLEDs using these polymers as hole transporting layer or interlayer.

SUMMARY OF THE INVENTION

The invention relates to polymers comprising one or more identical or different units of formula I

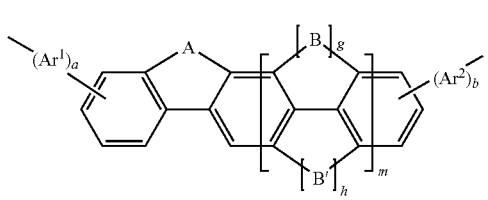

and one or more identical or different units of formula II

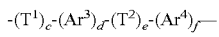

wherein
A, B and B' are independently of each other, and in case of multiple occurrence independently of one another, a divalent group, preferably selected from —CR$^1$R$^2$—, —NR$^1$—, —PR$^1$—, —O—, —S—, —SO—, —SO$_2$—, —CO—, —CS—, —CSe—, —P(=O)R$^1$—, —P(=S)R$^1$— and —SiR$^1$R$^2$—,
R$^1$ and R$^2$ are independently of each other identical or different groups selected from H, halogen, —CN, —NC, —NCO, —NCS, —OCN, —SCN, —C(=O)NR$^0$R$^{00}$, —C(=O)X, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, or carbyl or hydrocarbyl with 1 to 40 C atoms that is optionally substituted and optionally comprises one or more hetero atoms, and optionally the groups R$^1$ and R$^2$ form a spiro group with the fluorene moiety to which they are attached,
X is halogen,
R$^0$ and R$^{00}$ are independently of each other H or an optionally substituted carbyl or hydrocarbyl group optionally comprising one or more hetero atoms,
each g is independently 0 or 1 and each corresponding h in the same subunit is the other of 0 or 1,
m is an integer $\geq 1$,
Ar$^1$ and Ar$^2$ are independently of each other mono- or polynuclear aryl or heteroraryl that is optionally substituted and optionally fused to the 7,8-positions or 8,9-positions of the indenofluorene group,
a and b are independently of each other 0 or 1,
T$^1$ and T$^2$ are independently of each other selected from thiophene, selenophene, thieno[2,3b]thiophene, thieno[3,2b]thiophene, dithienothiophene and pyrrole, that are optionally substituted with one or more groups R$^3$,
R$^3$ is in case of multiple occurrence independently of one another halogen, —CN, —NC, —NCO, —NCS, —OCN, —SCN, —C(=O)NR$^0$R$^{00}$, —C(=O)X, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, or carbyl or hydrocarbyl with 1 to 40 C atoms that is optionally substituted and optionally comprises one or more hetero atoms, and optionally two groups R$^3$ in neighboured positions form a polycyclic group with the ring(s) to which they are attached, Ar$^3$ and Ar$^4$ are independently of each other mononuclear or polynuclear aryl or heteroaryl, which is optionally substituted and optionally fused to the 2,3-positions of one or both of the adjacent thiophene or selenophene groups,
c and e are independently of each other 0, 1, 2, 3 or 4, with $1 < c+e \leq 6$,
d and f are independently of each other 0, 1, 2, 3 or 4,
with the proviso that, if formula I denotes 6,6-12,12-tetraalkyl trans-indenofluorene, then formula II is different from unsubstituted or alkylated di-, ter- or quaterthiophene or dithieno[3,2-b:2',3'-e]pyridine.

The invention further relates to an organic semiconductor (OSC) material, layer or component comprising one or more polymers as described above and below.

The invention further relates to an organic electroluminescent (OEL) material, layer or component comprising one or more polymers as described above and below.

The invention further relates to the use of the polymers or materials as described above and below in an electronic, electroluminescent or electrooptical component or device.

The invention further relates to an electronic, electroluminescent or electrooptical component or device comprising a polymer or material as described above and below.

Said component or device includes, without limitation, an organic field effect transistor (OFET), thin film transistor (TFT), integrated circuit (IC), radio frequency identification (RFID) tag, photodetector, sensor, logic circuit, memory element, capacitor, organic photovoltaic (OPV) cell, charge injection layer, Schottky diode, planarising layer, antistatic film, conducting substrate or pattern, polymer electrolyte membrane (PEM), organic photorefractive device, photoconductor, electrophotographic element, field-quenching device, organic light emitting transistor (OLET), organic light emitting diode (OLED), or organic laser diode (O-Laser).

DETAILED DESCRIPTION OF THE INVENTION

Figure 1:
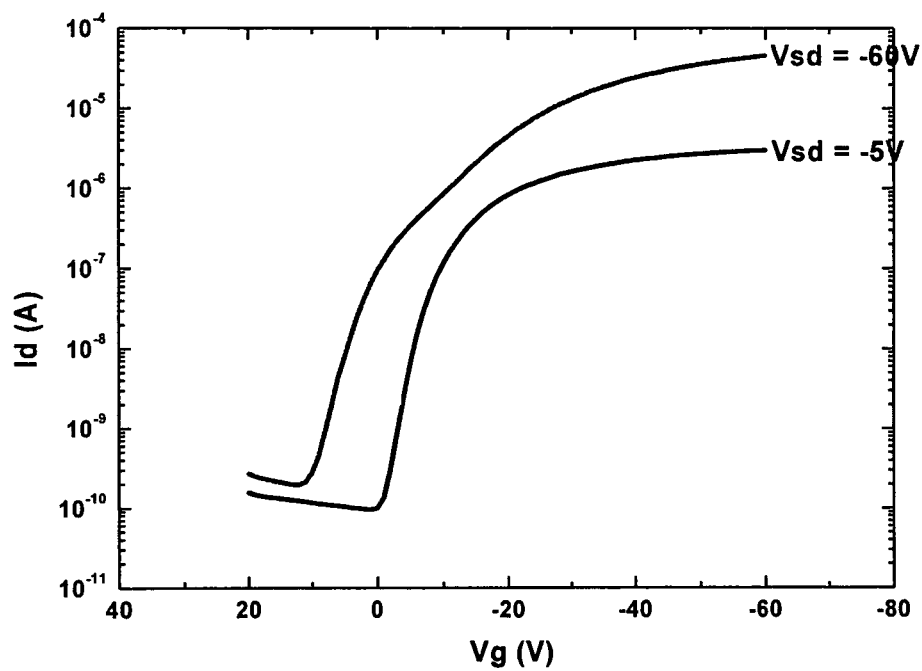
FIG. 1 shows the transfer scan of an OFET prepared according to example 4.

Unless stated otherwise, groups or indices like Ar$^1$, R$^1$, a etc. in case of multiple occurrence are selected independently from each other and may be identical or different from each other. Thus, several different groups might be represented by a single label like "R$^1$".

The term 'unit' means a monomer unit or a repeating unit in a polymer or copolymer.

The term 'subunit' means, in the units of formula I, the group

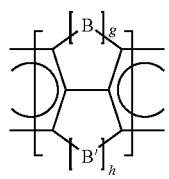

A subunit in the units of formula I wherein g is 1 and h is 0 is accordingly of the following structure:

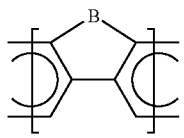

A subunit in the units of formula I wherein g is 0 and h is 1 is accordingly of the following structure:

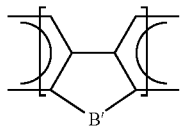

The term 'aryl' or 'arylene' means an aromatic hydrocarbon group or a group derived from an aromatic hydrocarbon group. The term 'heteroaryl' or 'heteroarylene' means an 'aryl' or 'arylene' group comprising one or more hetero atoms. The terms 'alkyl', 'aryl', 'heteroaryl' etc. also include multivalent species, for example alkylene, arylene, 'heteroarylene' etc.

The term 'carbyl group' as used above and below denotes any monovalent or multivalent organic radical moiety which comprises at least one carbon atom either without any non-carbon atoms (like for example —C≡C—), or optionally combined with at least one non-carbon atom such as N, O, S, P, Si, Se, As, Te or Ge (for example carbonyl etc.). The terms 'hydrocarbon group', and 'hydrocarbyl group' denote a carbyl group that does additionally contain one or more H atoms and optionally contains one or more hetero atoms like for example N, O, S, P, Si, Se, As, Te or Ge.

A carbyl or hydrocarbyl group comprising a chain of 3 or more C atoms may be linear, branched and/or cyclic, including spiro and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryl, arylalkyl, alkylaryloxy, arylalkyloxy arylcarbonyl, aryloxycarbonyl, arylcarbonyloxy and aryloxycarbonyloxy, each of which is optionally substituted and has 6 to 40, preferably 6 to 25 C atoms.

The carbyl or hydrocarbyl group may be a saturated or unsaturated acyclic group, or a saturated or unsaturated cyclic group. Unsaturated acyclic or cyclic groups are preferred, especially alkenyl and alkynyl groups (especially ethynyl). Where the $C_1$-$C_{40}$ carbyl or hydrocarbyl group is acyclic, the group may be linear or branched.

The $C_1$-$C_{40}$ carbyl or hydrocarbyl group includes for example: $C_1$-$C_{40}$ alkyl, $C_2$-$C_{40}$ alkenyl, $C_2$-$C_{40}$ alkynyl, $C_3$-$C_{40}$ alkyl group, $C_4$-$C_{40}$ alkyldienyl, $C_4$-$C_{40}$ polyenyl, $C_6$-$C_{40}$ aryl, $C_6$-$C_{40}$ alkylaryl, $C_6$-$C_{40}$ arylalkyl, $C_6$-$C_{40}$ alkylaryloxy, $C_6$-$C_{40}$ arylalkyloxy, $C_6$-$C_{40}$ heteroaryl, $C_4$-$C_{40}$ cycloalkyl, $C_4$-$C_{40}$ cycloalkenyl, and the like. Very preferred are $C_1$-$C_{20}$ alkyl, $C_2$-$C_{20}$ alkenyl, $C_2$-$C_{20}$ alkynyl, $C_3$-$C_{20}$ alkyl, $C_4$-$C_{20}$ alkyldienyl, $C_6$-$C_{12}$ aryl, $C_6$-$C_{20}$ arylalkyl and $C_6$-$C_{20}$ heteroaryl.

Further preferred carbyl and hydrocarbyl groups include straight-chain, branched or cyclic alkyl with 1 to 40, preferably 1 to 25 C-atoms, which is unsubstituted, mono- or polysubstituted by F, Cl, Br, I or CN, and wherein one or more non-adjacent $CH_2$ groups are optionally replaced, in each case independently from one another, by —O—, —S—, —NH—, —NR$^0$—, —SiR$^0$R$^{00}$—, —CO—, —COO—, —OCO—, —O—CO—O—, —S—CO—, —CO—S—, —CO—NR$^0$—, —NR$^0$—CO—, —NR$^0$—CO—NR$^{00}$, —CX$^1$=CX$^2$— or —C≡C— in such a manner that O and/or S atoms are not linked directly to one another, with R$^0$ and R$^{00}$ having one of the meanings given as described above and below and X$^1$ and X$^2$ being independently of each other H, F, Cl or CN.

R$^0$ and R$^{00}$ are preferably selected from H, straight-chain or branched alkyl with 1 to 12 C atoms or aryl with 6 to 12 C atoms.

Halogen is F, Cl, Br or I.

Preferred alkyl groups include, without limitation, methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, 2-ethylhexyl, n-heptyl, cycloheptyl, n-octyl, cyclooctyl, dodecanyl, trifluoromethyl, perfluoro-n-butyl, 2,2,2-trifluoroethyl, perfluorooctyl, perfluorohexyl etc.

Preferred alkenyl groups include, without limitation, ethenyl, propenyl, butenyl, pentenyl, cyclopentenyl, hexenyl, cyclohexenyl, heptenyl, cycloheptenyl, octenyl, cyclooctenyl etc.

Preferred alkynyl groups include, without limitation, ethynyl, propynyl, butynyl, pentynyl, hexynyl, octynyl etc.

Preferred alkoxy groups include, without limitation, methoxy, ethoxy, 2-methoxyethoxy, n-propoxy, i-propoxy, n-butoxy, i-butoxy, s-butoxy, t-butoxy, 2-methylbutoxy, n-pentoxy, n-hexoxy, n-heptoxy, n-octoxy etc.

Preferred amino groups include, without limitation, dimethylamino, methylamino, methylphenylamino, phenylamino, etc.

Aryl groups may be mononuclear, i.e. having only one aromatic ring (like for example phenyl or phenylene), or polynuclear, i.e. having two or more aromatic rings which may be fused (like for example napthyl or naphthylene), individually covalently linked (like for example biphenyl), and/or a combination of both fused and individually linked aromatic rings. Preferably the aryl group is an aromatic group which is substantially conjugated over substantially the whole group.

Preferred aryl groups include, without limitation, benzene, biphenylene, triphenylene, [1,1':3',1"]terphenyl-2'-ylene, naphthalene, anthracene, binaphthylene, phenanthrene, pyrene, dihydropyrene, chrysene, perylene, tetracene, pentacene, benzpyrene, fluorene, indene, indenofluorene, spirobifluorene, etc.

Preferred heteroaryl groups include, without limitation, 5-membered rings like pyrrole, pyrazole, imidazole, 1,2,3-triazole, 1,2,4-triazole, tetrazole, furan, thiophene, selenophene, oxazole, isoxazole, 1,2-thiazole, 1,3 thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings like pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, and fused systems like carbazole, indole, isoindole, indolizine, indazole, benzimidazole, benzotriazole, purine, naphthimidazole, phenanthrimidazole, pyridimidazole, pyrazin-imidazole, quinoxalinimidazole, benzoxazole, naphthoxazole, anthroxa-zole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, dithienopyridine, isobenzothiophene, dibenzothiophene, benzothiadiazothiophene, or combinations thereof. The heteroaryl groups may be substituted with alkyl, alkoxy, thioalkyl, fluoro, fluoroalkyl or further aryl or heteroaryl substituents.

Preferred arylalkyl groups include, without limitation, 2-tolyl, 3-tolyl, 4-tolyl, 2,6-dimethylphenyl, 2,6-diethylphenyl, 2,6-di-i-propylphenyl, 2,6-di-t-butylphenyl, o-t-butylphenyl, m-t-butylphenyl, p-t-butylphenyl, 4-phenoxyphenyl, 4-fluorophenyl, 3-carbomethoxyphenyl, 4-carbomethoxyphenyl etc.

Preferred alkylaryl groups include, without limitation, benzyl, ethylphenyl, 2-phenoxyethyl, propylphenyl, diphenylmethyl, triphenylmethyl or naphthalinylmethyl.

Preferred aryloxy groups include, without limitation, phenoxy, naphthoxy, 4-phenylphenoxy, 4-methylphenoxy, biphenyloxy, anthracenyloxy, phenanthrenyloxy etc.

The aryl, heteroaryl, carbyl and hydrocarbyl groups optionally comprise one or more substituents, preferably selected from silyl, sulpho, sulphonyl, formyl, amino, imino, nitrilo, mercapto, cyano, nitro, halogen, $C_{1-12}$ alkyl, $C_{6-12}$ aryl, $C_{1-12}$ alkoxy, hydroxy and/or combinations thereof. The optional substituents may comprise all chemically possible combinations in the same group and/or a plurality (preferably two) of the aforementioned groups (for example amino and sulphonyl if directly attached to each other represent a sulphamoyl radical).

Preferred substituents include, without limitation, solubilising groups such as alkyl or alkoxy, electron withdrawing groups such as fluorine, nitro or cyano, and substituents for increasing glass transition temperature (Tg) of the polymer such as bulky groups, e.g. tert-butyl or optionally substituted aryl groups.

Preferred substituents include, without limitation, F, Cl, Br, I, —CN, —NO$_2$, —NCO, —NCS, —OCN, —SCN, —C(=O)NR$^0$R$^{00}$, —C(=O)X, —C(=O)R$^0$, —NR$^0$R$^{00}$, wherein R$^0$, R$^{00}$ and X are as defined above, optionally substituted silyl, aryl with 4 to 40, preferably 6 to 20 C atoms, and straight chain or branched alkyl, alkoxy, alkylcarbonyl, alkoxycarbonyl, alkylcarbonlyoxy or alkoxycarbonyloxy with 1 to 20, preferably 1 to 12 C atoms, wherein one or more H atoms are optionally replaced by F or Cl.

The groups T$^1$ and T$^2$ are preferably selected of

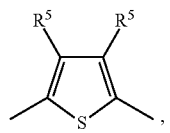

thiophene-2,5-diyl

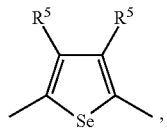

selenophene-2,5-diyl

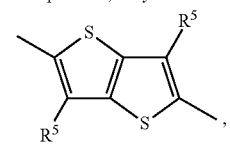

thieno[3,2b]thiophene-2,5-diyl

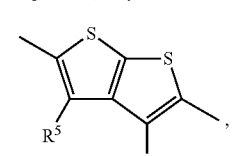

thieno[2,3b]thiophene-2,5-diyl

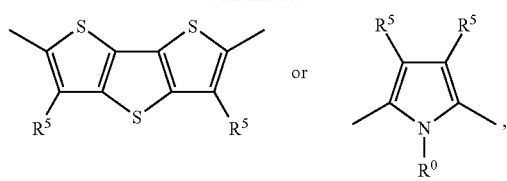

dithienothiophene-2,6-diyl pyrrole-2,5-diyl wherein R$^0$ is as defined in formula I and R$^5$ has one of the meanings of R$^3$ of formula I.

If the groups R$^1$ and R$^2$ form a spiro group together with the fluorene group to which they are attached, it is preferably spirobifluorene.

In the units of formula I m is preferably 1, 2 or 3.

Very preferred are units of formula I wherein in each subunit g is different than in the adjacent subunit, and h is different than in the adjacent subunit ("all-trans" units). Further preferred are units of formula I wherein in each subunit g is 1 and h is 0 ("all-cis" units).

The units of formula I are preferably selected from the following subformulae:

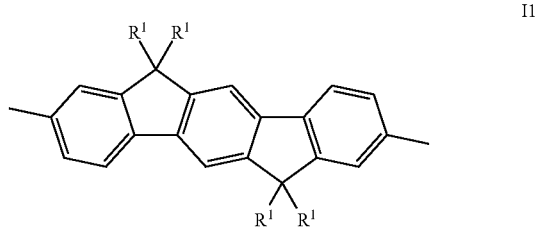

I1

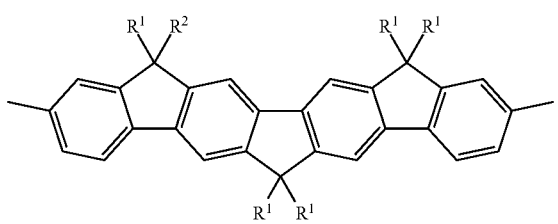

I2

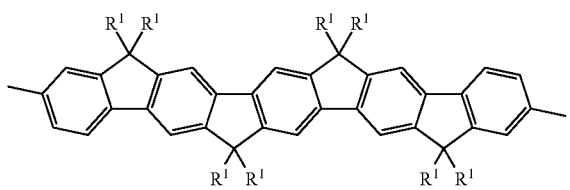

I3

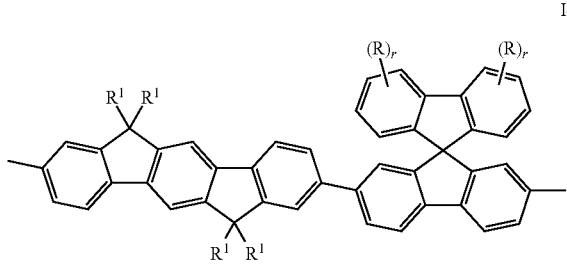

I4

-continued

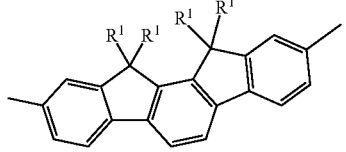
I5 wherein R¹ is as defined in formula I, R has in case of multiple occurrence independently of one another one of the meanings of R¹ given in formula I, and r is 0, 1, 2, 3 or 4.

Particularly preferred units of formula I are selected from the following subformulae:

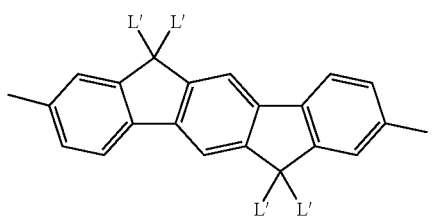
I1a

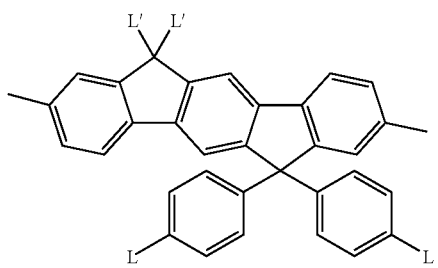
I1b

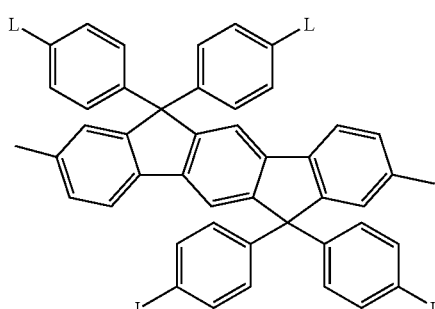
I1c

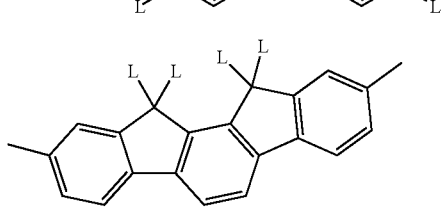
I5a wherein
L is H, halogen or optionally fluorinated, linear or branched alkyl or alkoxy with 1 to 12 C atoms, and is preferably H, F, methyl, i-propyl, t-butyl, n-pentoxy, or trifluoromethyl, and
L' is H, optionally fluorinated, linear or branched alkyl or alkoxy with 1 to 12 C atoms, and is preferably n-octyl or n-octyloxy.

The units of formula II are preferably selected from the following subformulae:

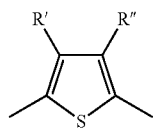
II1

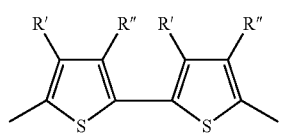
II2

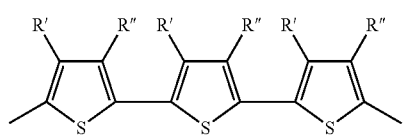
II3

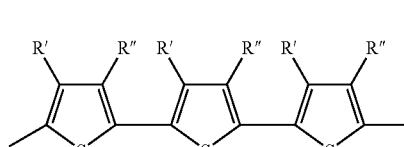
II4

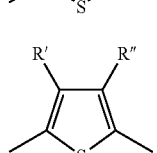
II5

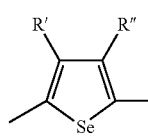
II6

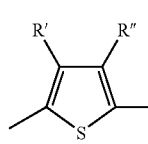
II7

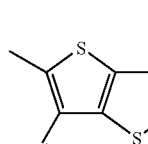
II8

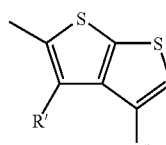
II9

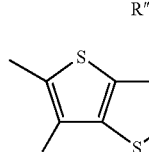
II10

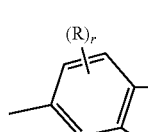
II11

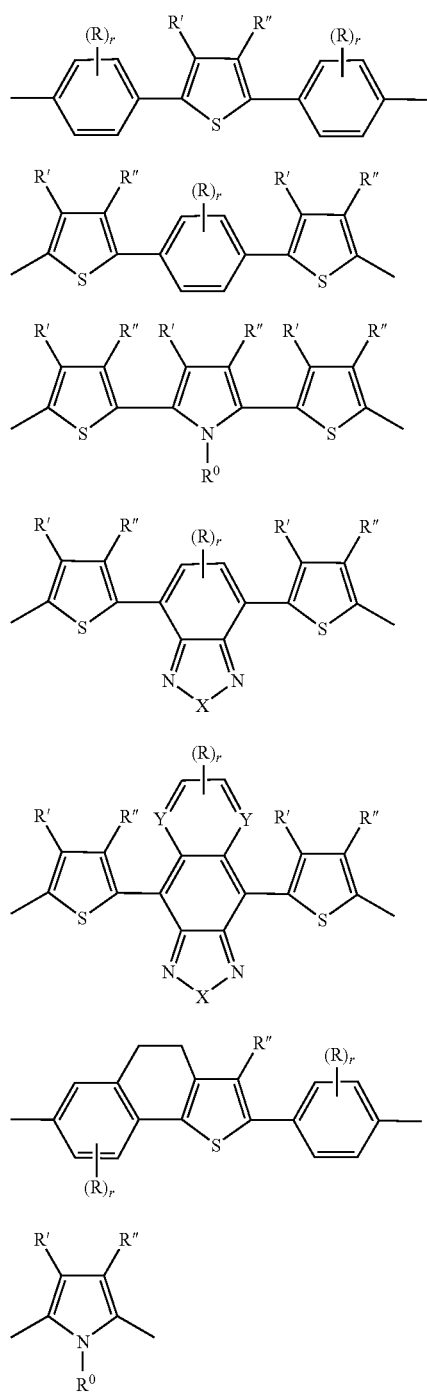

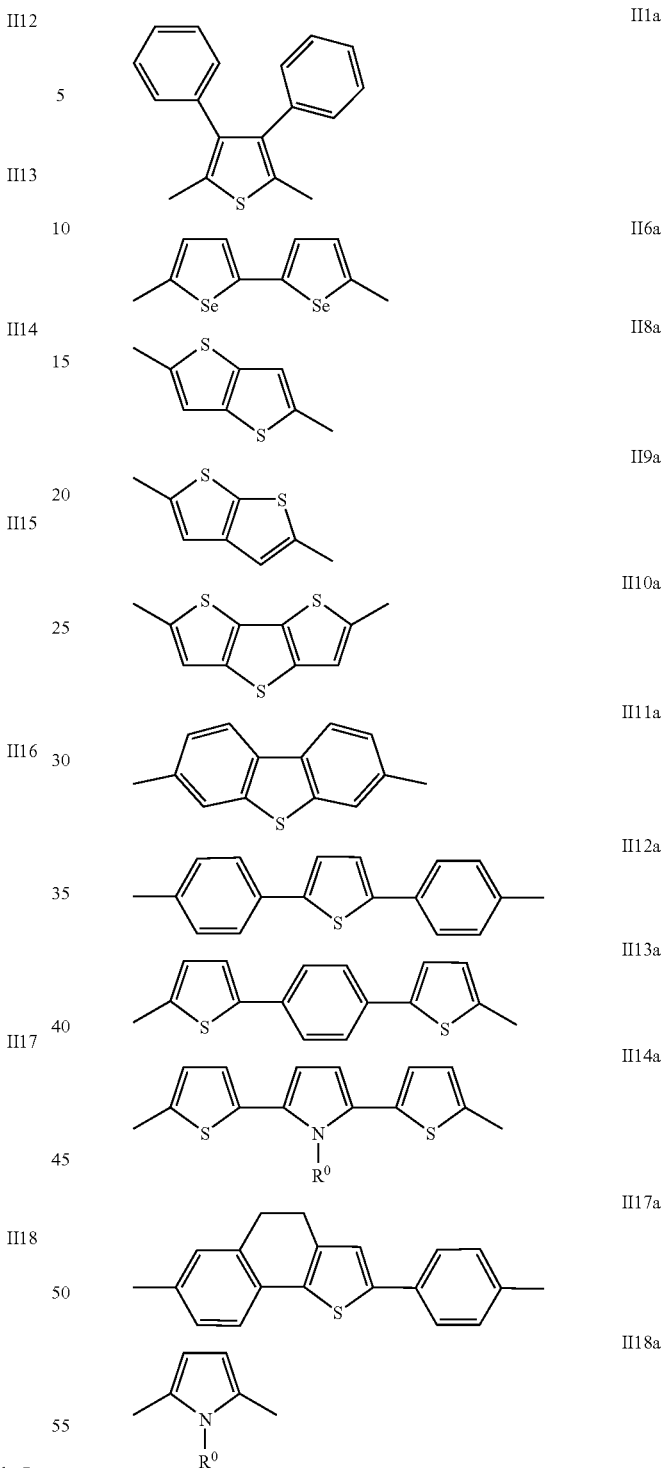

wherein Y is or N, X is S or Se, R⁰ is as defined in formula I, R', R" and R have in case of multiple occurrence independently of one another one of the meanings of $R^1$ in formula I, and r is 0, 1, 2, 3 or 4.

R' and R" in formula II1, II2, II3 and II4 are preferably different from H and n-alkyl, and are preferably linear or branched alkoxy, thioalkyl or fluorinated alkyl with 1 to 22 C-atoms.

Particularly preferred units of formula II are selected from the following subformulae:

wherein the thiophene, thienothiophene and phenyl groups may also be substituted with one or more groups R' as defined above, R⁰ is as defined above and is preferably $C_{1-8}$-alkyl, very preferably methyl.

The ratio of units of formula I in the polymers is preferably 1-50 mol %.

The ratio of units of formula II in the polymers is preferably 50-99 mol %.

In addition to the units of formula I and II as disclosed above and below, the polymers according to the present invention comprise one or more further units preferably selected from units have hole transporting properties. Suitable hole transporting units include, without limitation, triarylamine, benzidine, tetraaryl-para-phenylendiamine, triarylphosphine, phenothiazine, phenoxazine, dihydrophenazine, thianthrene, dibenzo-p-dioxine, phenoxathiine, carbazole, azulene, pyrrole and furan derivatives, or further O-, S- or N-containing heterocycles preferably having a high HOMO.

The amount of said additional units in the polymers is preferably 1-10 mol %.

Very preferably said additional units are selected from formula III

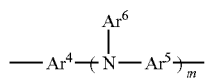
III wherein $Ar^{4-5}$ are, in case of multiple occurrence independently of one another, optionally substituted mononuclear or polynuclear aryl or heteroaryl, $Ar^6$ is optionally substituted mononuclear or polynuclear aryl or heteroaryl, which may be optionally substituted by a bridging group linking different chain residues of formula, and m is 1, 2 or 3.

The units of formula III are preferably selected from the following subformulae

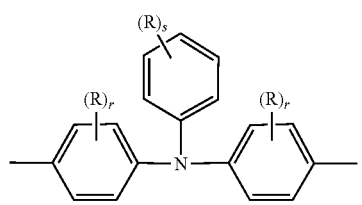
III1

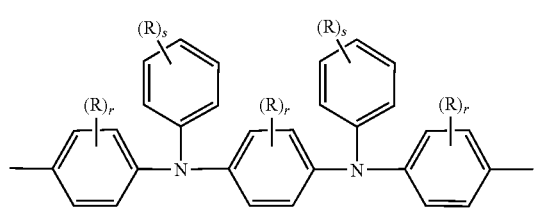
III2

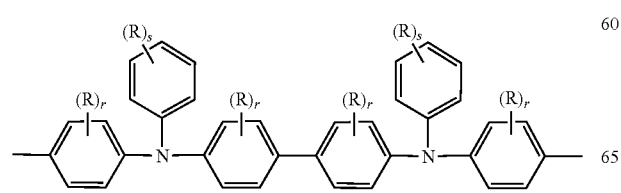
III3

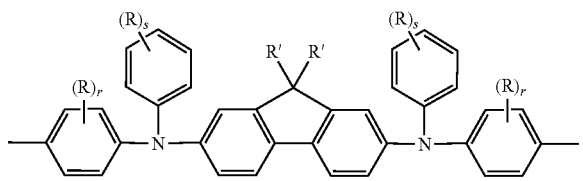
III4

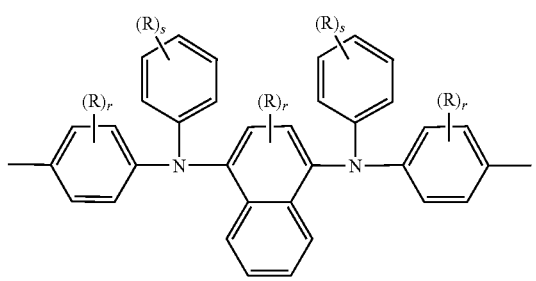
III5 wherein R, R' and r are as defined above and s is 0, 1, 2, 3, 4 or 5.

Particularly preferred units of formula III are selected from the following subformulae

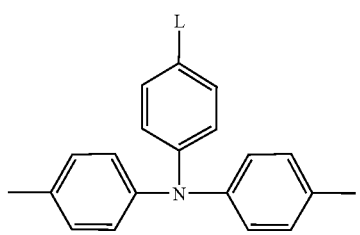
III1a

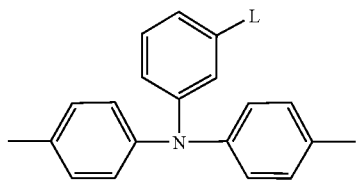
III1b

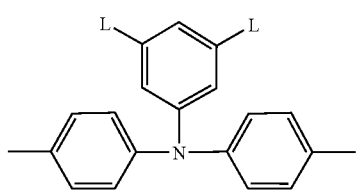
III1c

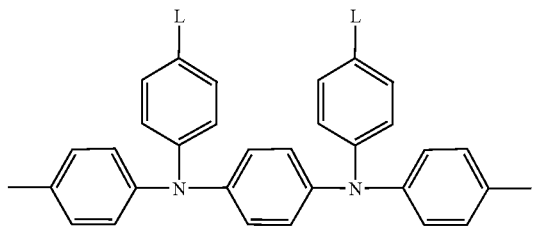
III2a

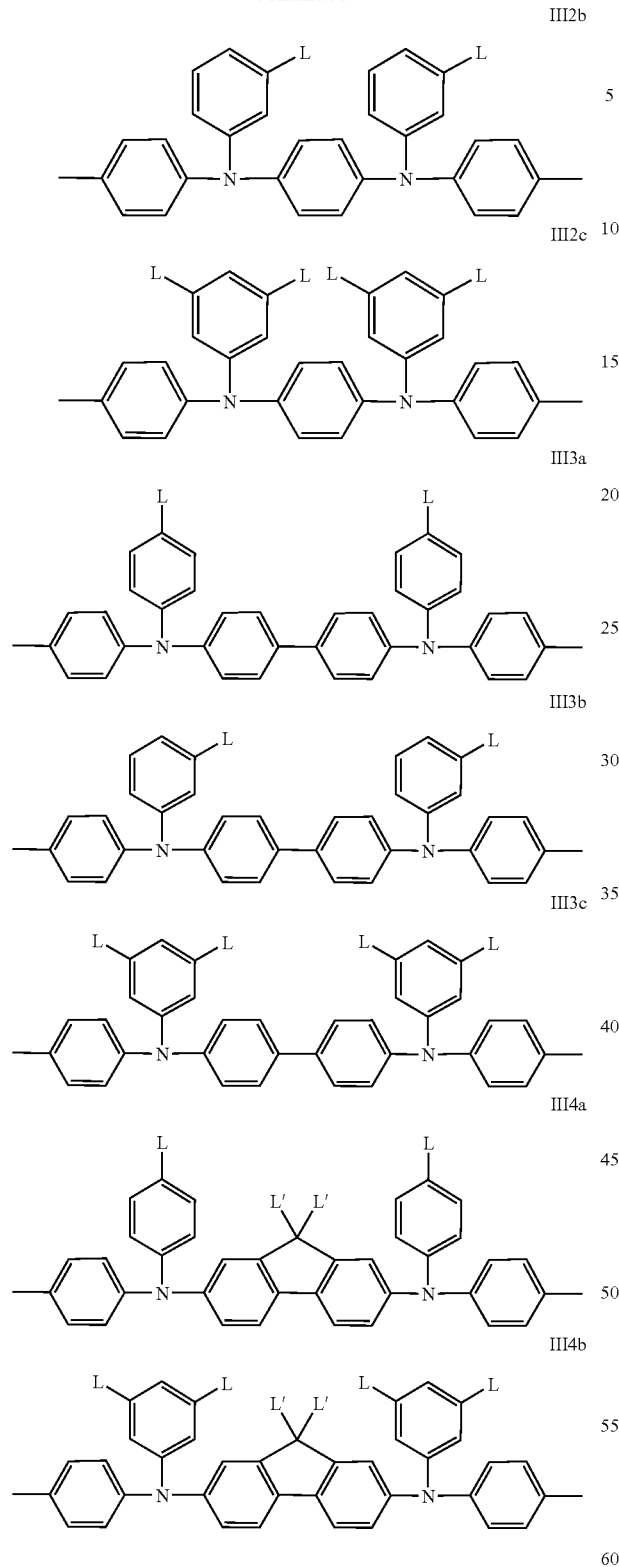
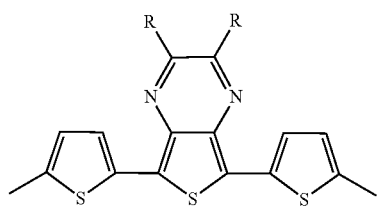
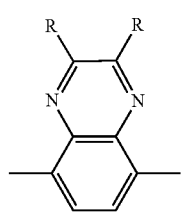
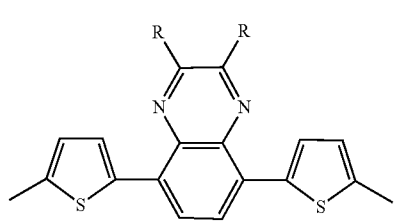
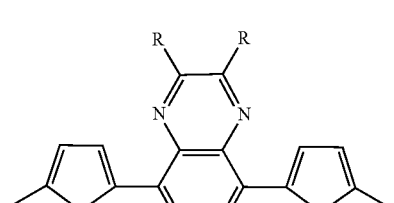
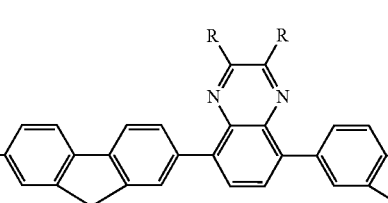
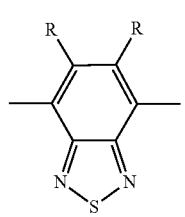
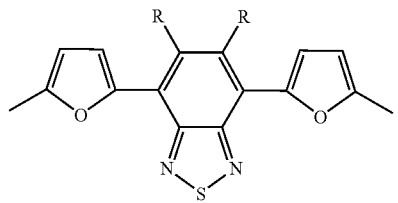
wherein L and L' are as defined above, L is preferably H, i-propyl, t-butyl or trifluoromethyl and L' is preferably H, n-octyl or n-octyloxy.
In addition or alternatively to the units of formula II, the polymers of the present invention may comprise one or more units selected from the following formulae

XI

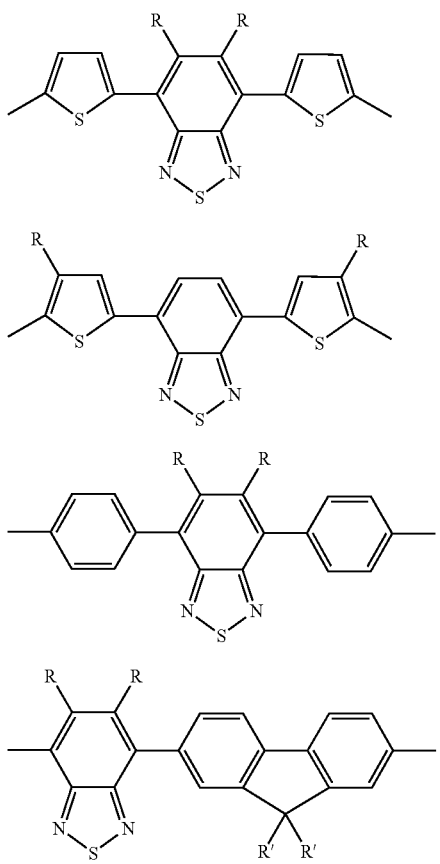

XII

XIII

XIV wherein R and R' are as defined above, and are preferably H, alkyl, aryl, perfluoroalkyl, thioalkyl, cyano, alkoxy, heteroaryl, alkylaryl, or arylalkyl.

In formulae IV-VIII, R is preferably H or phenyl. In formulae IX-XIV, R is preferably H or alkyl having 1, 2, 3, 4, 5 or 6 C atoms. R' is preferably n-octyl or n-octyloxy.

In addition or alternatively to the units of formula III-XV mentioned above, the polymers may comprise further units selected from phenylene, biphenylene, napthalene, anthracene, fluorene, bifluorene, spiro-bifluorene, phenylene-vinylene, carbazole, pyrene, perylene, 9,10-dihydrophenanthrene, fused thiophene like thieno[2,3b]thiophene or thieno[3,2b]thiophene, dithienothiophene, phenanthroline, or derivatives thereof.

The polymers of the present invention may be statistical or random copolymers, alternating or regioregular copolymers, block copolymers or combinations thereof. They may comprise two, three or more distinct monomer units.

The polymers are preferably selected of the following formula

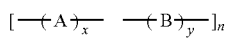                                    1 wherein
A is a unit of formula I or its preferred subformulae,
B is a unit of formula II or its preferred subformulae,
x is >0 and ≦0,5,
y is ≧0,5 and <1,
x+y is 1,
n is an integer>1.

Especially preferred are polymers of the following formula

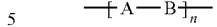                                    1A wherein
A is a unit of formula I or its preferred subformulae,
B is a unit of formula II or its preferred subformulae, and
n is as defined in formula 1.

Especially preferred are polymers of formula 1 and 1A wherein A is selected of formula I1a-I1b, I1c or I5a, and B is selected of formula III1a, II8a, II9a, II11a, II12a, III13a.

In the polymers according to the present invention, the number of repeating units n is preferably from 10 to 10,000, very preferably from 50 to 5,000, most preferably from 50 to 2,000.

The polymers of the present invention may be prepared by any suitable method. For example, they can be suitably prepared by aryl-aryl coupling reactions, such as Yamamoto coupling, Suzuki coupling, Stille coupling, Sonogashira coupling or Heck coupling. Suzuki coupling and Yamamoto coupling are especially preferred.

The monomers which are polymerised to form the repeat units of the polymers of the present invention can be prepared according to suitable methods which are known to the expert and have been disclosed in the literature. Suitable and preferred methods for the preparation of the indenofluorene monomers of formula I are described for example in WO 2004/041901. Suitable and preferred methods for the preparation of the triarylamine monomers of formula III are described for example in WO 99/54385. Suitable and preferred methods for the preparation of the thiophene monomers of formula II are described for example in WO 2005/014691 A2, EP 1 279 689 A2, EP 1 279 691 A1, EP 1 284 276 A1, EP 1 398 336 A1, EP 1 411 563 A2, EP 1 439 590 A2, EP 1 477 504 A1, EP 1 510 535 A1.

Preferably the polymers are prepared from monomers comprising one of the above mentioned groups of formula I-IXIV, which are linked to two polymerisable groups P. Accordingly, for example the monomers for the units of formula I1 are selected of the following formula

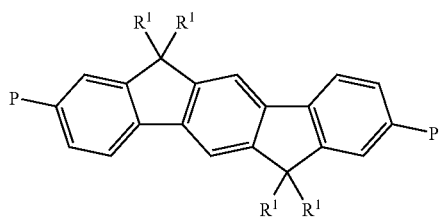                                    IA wherein P is a polymerisable group and $R^1$ is as defined above. The thiophene monomers for the units of formula II and the other co-monomers, like e.g. triarylamine monomers, are built accordingly.

Preferably the groups P are independently of each other selected from Cl, Br, I, O-tosylate, O-triflate, O-mesylate, O-nonaflate, $SiMe_{3-z}F_z$ (wherein z is 1 or 2), $O—SO_2Z$, $B(OZ^1)_2$, $—CZ^2=C(Z^2)_2$, $—C≡CH$ and $Sn(Z^3)_3$, wherein Z and $Z^{1-3}$ are selected from the group consisting of alkyl and aryl, each being optionally substituted, and two groups $Z^1$ may also form a cyclic group.

Another aspect of the invention is a process for preparing a polymer by coupling one or more monomers based on a unit of formula I with one or more monomers based on a unit of formula II, and optionally with further units, in a polymerisation reaction.

Preferred methods for polymerisation are those leading to C—C-coupling or C—N-coupling, like Suzuki polymerisation, as described for example in WO 00/53656, Yamamoto polymerisation, as described in for example in T. Yamamoto et al., Progress in Polymer Science 1993, 17, 1153-1205 or in WO 2004/022626 A1, and Stille coupling. For example, when synthesizing a linear polymer by Yamamoto polymerisation, a monomer as described above having two reactive halide groups P is preferably used. When synthesizing a linear polymer by Suzuki polymerisation, preferably a monomer as described above is used wherein at least one reactive group P is a boron derivative group.

Suzuki polymerisation may be used to prepare regioregular, block and random copolymers. In particular, random copolymers may be prepared from the above monomers wherein one reactive group P is halogen and the other reactive group P is a boron derivative group. Alternatively, block copolymers or alternating copolymers, in particular AB-type copolymers, may be prepared from a first and a second of the above monomers wherein both reactive groups of the first monomer are boron and both reactive groups of the second monomer are halide. The synthesis of block copolymers is described in detail for example in WO 2005/014688 A2.

It is also possible to prepare e.g. a polymer of formula 1A ("-[A-B]$_n$—") from a single monomer unit having the structure P-AB—P.

Suzuki polymerisation employs a Pd(0) complex or a Pd(II) salt. Preferred Pd(0) complexes are those bearing at least one phosphine ligand such as Pd(Ph$_3$P)$_4$. Another preferred phosphine ligand is tris(ortho-tolyl)phosphine, i.e. Pd(o-Tol)$_4$. Preferred Pd(II) salts include palladium acetate, i.e. Pd(OAc)$_2$. Suzuki polymerisation is performed in the presence of a base, for example sodium carbonate, potassium phosphate or an organic base such as tetraethylammonium carbonate. Yamamoto polymerisation employs a Ni(0) complex, for example bis(1,5-cyclooctadienyl) nickel(0).

As alternatives to halogens as described above, leaving groups of formula —O—SO$_2$Z can be used wherein Z is as described above. Particular examples of such leaving groups are tosylate, mesylate and triflate.

A further aspect of the present invention is an organic semiconductor material, layer or component comprising one or more polymers described above and below. A further aspect is the use of the polymers or materials as described above and below in an electronic or electrooptical component or device. A further aspect is an electronic component or device comprising a polymer or material as described above and below.

The electronic or electrooptical component or device is for example an organic field effect transistor (OFET), thin film transistor (TFT), integrated circuit (IC), radio frequency identification (RFID) tag, photodetector, sensor, logic circuit, memory element, capacitor, organic photovoltaic (OPV) cell, charge injection layer, Schottky diode, planarising layer, antistatic film, conducting substrate or pattern, photoconductor, electrophotographic element, organic light emitting transistors (OLETs), or organic light emitting diode (OLED).

The polymers of the present invention are typically used as organic semiconductors in form of thin organic layers or films, preferably less than 30 microns thick. Typically the semiconducting layer of the present invention is at most 1 micron (=1 μm) thick, although it may be thicker if required.

For various electronic device applications, the thickness may also be less than about 1 micron thick. For example, for use in an OFET or OLED, the layer thickness may typically be 100 nm or less. The exact thickness of the layer will depend, for example, upon the requirements of the electronic device in which the layer is used.

For example, the active semiconductor channel between the drain and source in an OFET may comprise a layer of the present invention. As another example, an interlayer or a charge transport layer in an OLED device may comprise a layer of the present invention.

An OFET device according to the present invention preferably comprises:
- a source electrode,
- a drain electrode,
- a gate electrode,
- a semiconducting layer,
- one or more gate insulator layers,
- optionally a substrate.

wherein the semiconductor layer preferably comprises one or more polymers as described above and below.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

Preferably the electronic device is an OFET comprising an insulator having a first side and a second side, a gate electrode located on the first side of the insulator, a layer comprising a polymer of the present invention located on the second side of the insulator, and a drain electrode and a source electrode located on the polymer layer.

The OFET device can be a top gate device or a bottom gate device. Suitable structures and manufacturing methods of an OFET device are known to the skilled in the art and are described in the literature, for example in WO 03/052841.

The gate insulator layer may comprise for example a fluoropolymer, like e.g. the commercially available Cytop 809M® or Cytop 107M® (from Asahi Glass). Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75® (available from Acros, catalogue number 12380). Other suitable fluoropolymers and fluorosolvents are known in prior art, like for example the perfluoropolymers Teflon AF® 1600 or 2400 (from DuPont) or Fluoropel® (from Cytonix) or the perfluorosolvent FC 43® (Acros, No. 12377).

Further preferred is an integrated circuit comprising a field effect transistor according to the present invention.

Further preferred is polymer OLEDs comprising an interlayer containing the polymer or material according to the present invention.

Further preferred is a photovoltaic cell comprising a polymer or layer according to the present invention.

Besides the devices mentioned above, the polymers of the present invention may also function as electron transporting or light emissive components of an organic light emitting device (OLED).

Another aspect of the invention relates to a solution comprising one or more polymers as described above and below and one or more organic solvents.

Examples of suitable and preferred organic solvents include, without limitation, dichloromethane, trichloromethane, monochlorobenzene, o-dichlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetralin, decalin, indane and/or mixtures thereof.

The concentration of the polymers in the solution is preferably 0.1 to 10% by weight, more preferably 0.5 to 5% by weight. Optionally, the solution includes the binders to adjust the rheoloigic property, as described in WO2005055248.

After the appropriate mixing and ageing, solutions are evaluated as one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in "Crowley, J. D., Teague, G. S. Jr and Lowe, J. W. Jr., Journal of Paint Technology, 38, No 496, 296 (1966)". Solvent blends may also be used and can be identified as described in "Solvents, W. H. Ellis, Federation of Societies for Coatings Technology, p 9-10, 1986". Such a procedure may lead to a blend of 'non' solvents that will dissolve both the polymers of the present invention, although it is desirable to have at least one true solvent in a blend.

Another aspect of the invention relates to a dispersion comprising one or more polymers as described above and below and in water or one or more organic solvents; particularly wherein one or more polymers as described above and below are sulfonated or phosphonated and formed a dispersion in water or one/more organic solvents. Suitable and preferred methods for sulfonation or phosphosation are described in Chemical Review 2004, Vol 104, 45687. Such dispersions are suitable for example for use in polymer electrolyte membranes (PEMs).

It is desirable to generate small structures or patterns in modern microelectronics to reduce cost (more devices/unit area), and power consumption. Patterning of the layer of the invention may be carried out by photolithography or electron beam lithography.

For use as semiconducting layer the polymers or solutions of the present invention may be deposited by any suitable method. Liquid coating of organic electronic devices such as field effect transistors is more desirable than vacuum deposition techniques. Solution deposition methods are especially preferred. Preferred deposition techniques include, without limitation, dip coating, spin coating, ink jet printing, letterpress printing, screen printing, doctor blade coating, roller printing, reverse-roller printing, offset lithography printing, flexographic printing, web printing, spray coating, brush coating or pad printing. Ink-jet printing is particularly preferred as it allows high resolution displays to be prepared.

Selected solutions of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the polymers should be first dissolved in a suitable solvent. Solvents must fulfil the requirements stated above and must not have any detrimental effect on the chosen print head. Additionally, solvents should have boiling points >100° C., preferably >140° C. and more preferably >150° C. in order to prevent operability problems caused by the solution drying out inside the print head. Apart from the solvents mentioned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

A preferred solvent for depositing a polymer according to the present invention by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the polymer, which reduces or prevents clogging of the jets and separation of the components during spraying. The solvent(s) may include those selected from the following list of examples: dodecylbenzene, 1-methyl-4-tert-butylbenzene, terpineol limonene, isodurene, terpinolene, cymene, diethylbenzene. The solvent may be a solvent mixture, that is a combination of two or more solvents, each solvent preferably having a boiling point>100° C., more preferably >140° C. Such solvent(s) also enhance film formation in the layer deposited and reduce defects in the layer.

The ink jet fluid (that is mixture of solvent, binder and semiconducting compound) preferably has a viscosity at 20° C. of 1-100 mPa·s, more preferably 1-50 mPa·s and most preferably 1-30 mPa·s.

The polymers or solutions according to the present invention can additionally comprise one or more further components like for example surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles, or inhibitors.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

The invention will now be described in more detail by reference to the following examples, which are illustrative only and do not limit the scope of the invention.

Unless stated otherwise, all specific values of physical parameters like the permittivity (ε), charge carrier mobility (μ), solubility parameter (δ) and viscosity (η) as given above and below refer to a temperature of 20° C. (+/−1° C.).

EXAMPLE 1

Polymer (1) is prepared as described below.

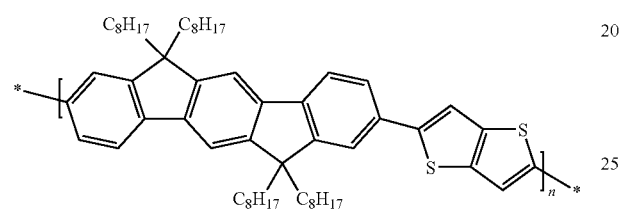

(1)

Poly-{2,8-[6,6,12,12-tetraoctyl-6,12-dihvdo-indeno[1,2-b]fluorene]-alt-2,5-thieno[2,3-b]thiophene A mixture of bis-2,8-[6,6,12,12-tetraoctyl-6,12-dihydro-indeno[1,2-b]fluorene boronate ester (500 mg, 0.59 mmol) and 2,5-dibromo-thieno[3,4-b]thiophene (177 mg, 0.59 mmol) is dissolved in toluene (10 mL) at 50° C. When fully dissolved tetrakis(triphenylphosphine)palladium (21 mg, 0.02 mmol) is added followed by tetraethylammonium hydroxide solution (20 wt %, 2.50 mg). The mixture is stirred at 110° C. for 6 h. The reaction mixture is poured into methanol (150 mL) and stirred for 1 h at 20° C. The polymer is filtered into a Soxhlet thimble and washed via Soxhlet extraction using acetone for 5 h. The extraction solvent is exchanged for iso-hexane and washing continued overnight. The polymer is isolated, dissolved in chlorobenzene with heating, and then added dropwise to methanol with stirring. The polymer is collected by filtration and dried in vacuo.

Yield: 0.38 g. Mn 45,700, Mw 172,800, PD 3.78. UV-Vis-lambda max-472 nm. NMR shows broad peaks.

EXAMPLE 2

Polymer (2) is prepared as described below.

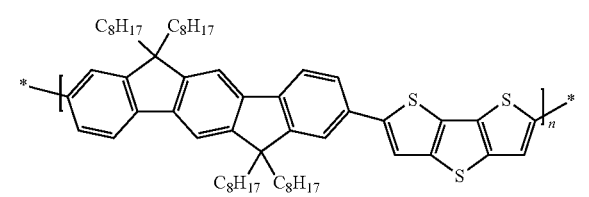

(2)

Poly-{2,8-[6,6,12,12-tetraoctyl-6,12-dihydo-indeno[1,2-b]fluorene]-alt-2,6-dithieno[3,2-b;2',3'-d]thiophene A mixture of bis-2,8-[6,6,12,12-tetraoctyl-6,12-dihydro-indeno[1,2-b]fluorene boronate ester (500 mg, 0.59 mmol) and 2,6-dibromo-dithieno[3,2-b;2',3'-d]thiophene (177 mg, 0.59 mmol) is dissolved in toluene (10 mL) at 50° C. When fully dissolved, tetrakis(triphenyl-phosphine) palladium (21 mg, 0.02 mmol) is added followed by tetraethylammonium hydroxide solution (20 wt %, 2.50 mg). The mixture is stirred at 110° C. for 6 h. The reaction mixture is poured into methanol (150 mL) and stirred for 1 h at 20° C. The polymer is filtered into a Soxhlet thimble and washed via Soxhlet extraction using acetone for 6 h. The extraction solvent is exchanged for iso-hexane/2-methylpentane and washing continued overnight. The polymer is isolated, dissolved in chloroform, and then added dropwise to iso-hexane with stirring. The polymer is collected by filtration and dried in vacuo.

Yield: 0.39 g. Mn 85,000, Mw 276,800, PD 3.26. UV-Vis-lambda max-476 nm. NMR shows broad peaks.

EXAMPLE 3

Energy Levels

The charge transport property of a polymer depends both on the degree of the energy disorder, and the levels of the molecular orbitals, through which the charge carrier is transported. The former is related to the polymer chain morphology, and for the energy levels of molecular orbitals, most important are the highest occupied molecular orbital (HOMO) and the lowest unoccupied molecular orbital (LUMO). Both of the morphology and the energy levels can be simulated by the well-established quantum chemistry methods, for example AM1 and DFT (density functional theory).

The applicants established a very consistent combination method to determine the energy levels of organic materials. The HOMO/LUMO levels of a set of materials (more than 20 different materials) are measured by CV (cyclovoltammetry) with a stable evaluation method, and also calculated by the AM1 of CaChe. The calculated values are then calibrated according to the measured values. Such calibration factor is used for further calculation. Therefore, the comparison of the energy levels of this invention can be set on a sound base.

The simulation was done on pentamers of the formula X-I1a-X-I1a-X, wherein X is a group of the above-mentioned preferred formulae II1a-II18a as shown in table 1 (without further substitution, and wherein R⁰ in II18a is methyl), and I1a is an indenofluorene group of the above-mentioned preferred formula I1a wherein L' is —CH₃. As reference the following group is used:

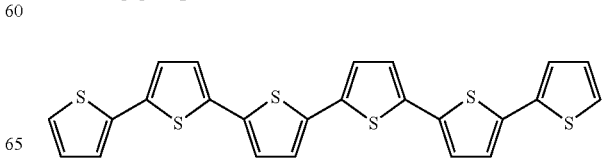

The results are summarized in Table 1 below.

TABLE 1

| X | HOMO Calibrated [eV] | LUMO Calibrated [eV] |
|---|---|---|
| II6a | −5.01 | −2.69 |
| II8a | −5.38 | −2.74 |
| II9a | −5.38 | −2.60 |
| II10a | −5.35 | −2.81 |
| II12a | −5.49 | −2.67 |
| II13a | −5.39 | −2.75 |
| II14a | −4.77 | −2.61 |
| II17a | −5.40 | −2.65 |
| II18a | −5.17 | −2.48 |
| Reference | −5.32 | −2.89 |

As can be seen, all pentamers have a comparable HOMO or shallower HOMO than the reference, and a quite flat chain structure, which is in favor of super inter-molecular structure. Both features are very good for use as hole transport materials.

EXAMPLE 4

OFET Devices

Thin-film bottom gate, bottom contact organic field-effect transistors (OFETs) are fabricated in a dry nitrogen glove box environment on highly doped silicon substrates with thermally grown silicon oxide ($SiO_2$) insulating layer (thickness 230 nm), where the substrate served as a common gate electrode. Transistor source-drain gold contacts are photolithographically defined on the $SiO_2$ layer. FET substrates are solvent cleaned and then ozone treated for 10 min in a custom built low-pressure mercury lamp setup. Devices are then treated with octyltrichlorosilane by immersing substrates in 10 mM solutions in heated toluene (60° C.) for 15 min, followed by a thorough washing with hexane, acetone and isopropanol. Thin semiconductor films are then deposited by spin-coating solutions in warm 1,2-dichlorobenzene (10 mg/ml) at a spin speed of 3,000 rpm. The samples are then dried and annealed at 100° C. for 10 min and measured in the absence of light. Field effect mobility $\mu^{sat}$ is calculated in the saturation regime ($V_d$>($V_g$−$V_0$)) using equation (1):

$$\left(\frac{dI_d^{sat}}{dV_g}\right)_{V_d} = \frac{WC_i}{L}\mu^{sat}(V_g - V_0) \quad (1)$$

where W is the channel width, L the channel length, $C_i$ the capacitance of insulating layer, $V_d$ the drain voltage, $V_g$ the gate voltage, $V_0$ the turn-on voltage and $I_d$ the drain current.

Bottom gate, bottom contact OFET devices are prepared as described above, using as semiconducting component the polymers of example 1 and 2, and poly(3hexylthiophene) (P3HT) for comparison. The device performance is measured as described above. The results are summarized in Table 2 and FIGS. 1 and 2.

Table 2 shows the mobility of polymer 1 and polymer 2 using poly-3-hexylthiophene (P3HT) as reference:

TABLE 2

| Polymer | Mobility (cm²/Vs) | On/Off ratio |
|---|---|---|
| (1) | 0.006 | 1 × 10⁵ |
| (2) | 0.004 | 1 × 10⁶ |
| P3HT | 0.03 | 1 × 10⁵ |

It can be seen that polymer 1 and polymer 2 have a slightly lower mobility than P3HT, but show comparable or even one order of magnitude higher on/off ratio than P3HT.

Figure 2:
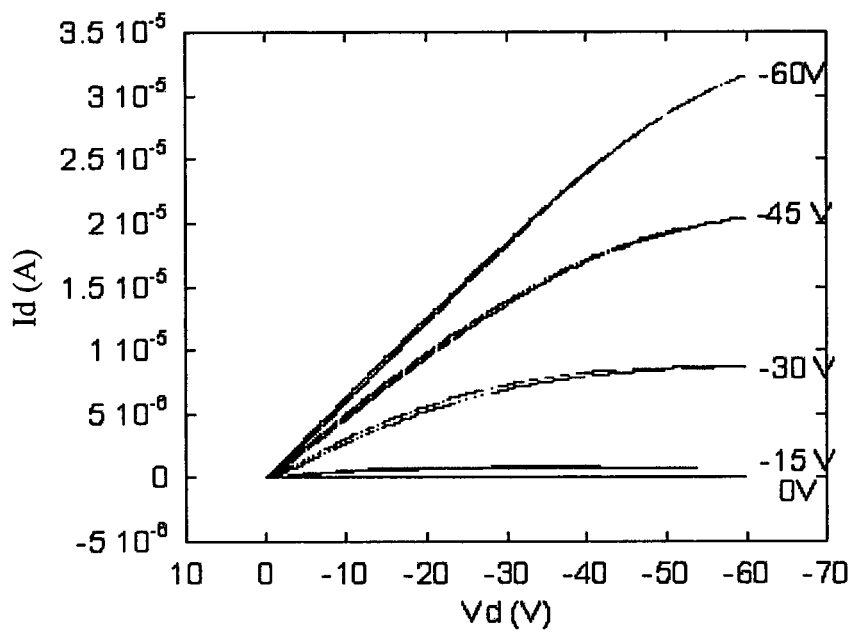
FIG. 2 shows the output plot of an OFET prepared according to example 4.

FIGS. 1 and 2 show the transfer and output characteristic of the OFET with polymer 1. FIG. 1 shows the transfer scan with forward and reverse characteristics of the OFET. FIG. 2 shows the output plot of the OFET measured at different gate voltages. This shows that polymer 1 is useful to prepare an OFET with good transfer and output characteristics.

The invention claimed is:

1. A polymer comprising one or more identical or different units selected from the group consisting of:

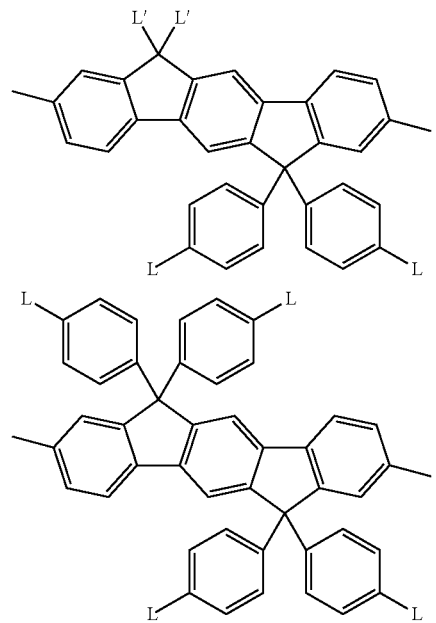

wherein

L is H, halogen, or optionally fluorinated, linear or branched alkyl or alkoxy having 1 to 12 C atoms; and L' is optionally fluorinated, linear or branched alkyl or alkoxy having 1 to 12 C atoms; and one or more identical or different units selected from the group consisting of (II1), (II2), (II3), (II4), (II5), (II6), (II7), (II8), (II9), (II10), (II11), (II12), (II13), (II14), (II17), and (II18):

(II1)

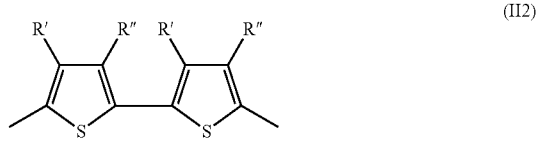

(II2)

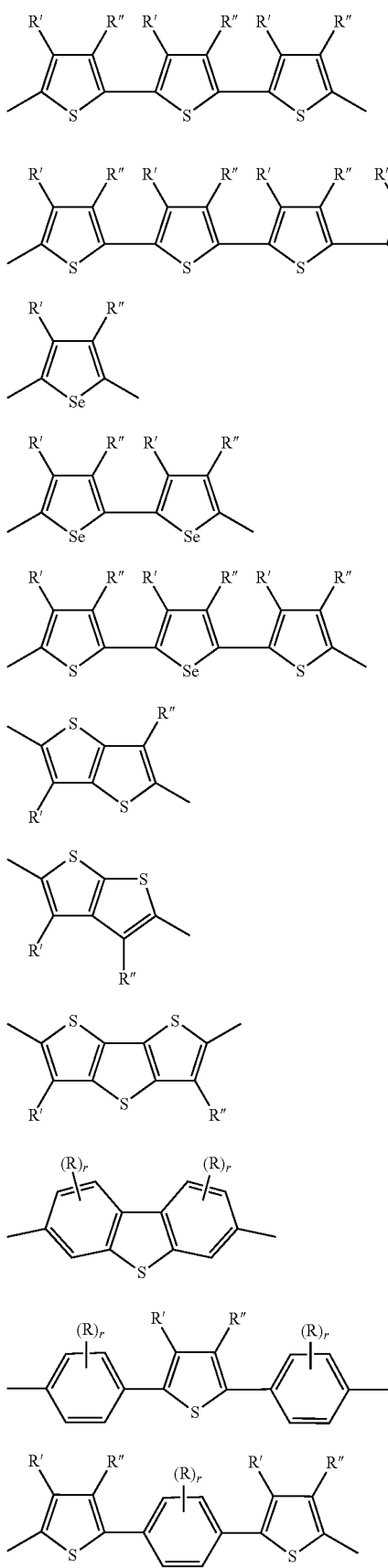

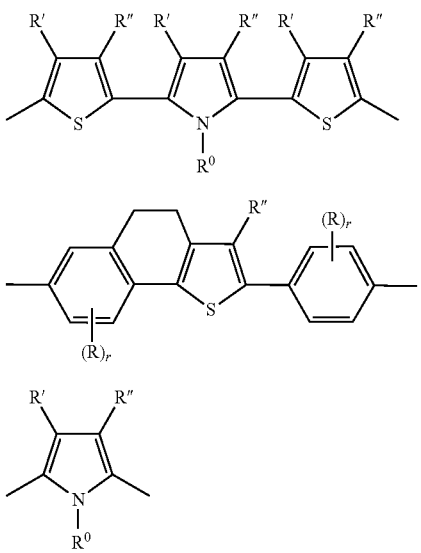

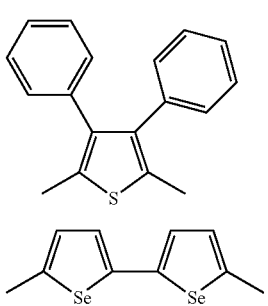

wherein

R, R', and R" are, independently of each other, and in the case of multiple occurrence, independently of one another, identical or different groups selected from the group consisting of H, halogen, —CN, —NC, —NCO, —NCS, —OCN, —SCN, —C(=O)NR$^0$R$^{00}$, —C(=O)X, —C(=O)R$^0$, —NH$_2$, —NR$^0$R$^{00}$, —SH, —SR$^0$, —SO$_3$H, —SO$_2$R$^0$, —OH, —NO$_2$, —CF$_3$, —SF$_5$, optionally substituted silyl, or carbyl or hydrocarbyl having 1 to 40 C atoms, wherein said carbyl or hydrocarbyl is optionally substituted and optionally comprises one or more hetero atoms, and wherein the groups R' and R" optionally define a spiro group with the fluorene moiety to which they are attached;

R$^0$ is H or an optionally substituted carbyl or hydrocarbyl group optionally comprising one or more hetero atoms;

when the comonomer unit is formula (II1), only one of R' and R" is hydrogen.

2. The polymer of claim 1, wherein

L is H, F, methyl, i-propyl, t-butyl, n-pentoxy, or trifluoromethyl; and

L' is n-octyl or n-octyloxy.

3. The polymer of claim 1, wherein said units of formula (II1), (II6), (II8), (II9), (II10), (II11), (II12), (II13), (II14), (II17), and (II18) are units or formulae (II1a), (II6a), (II8a), (II9a), (II10a), (II11a), (II12a), (II13a), (II14a), (II17a), and (II18a), respectively:

wherein

R⁰ is $C_{1-8}$-alkyl.

4. The polymer of claim 1, wherein said polymer further comprises one or more units of formula III $$—Ar^4—(N(Ar^6)—Ar^5)_m—$$ (III)

wherein $Ar^4$, $Ar^5$, and $Ar^6$ are, independently of one another, and in the case of multiple occurrence, independently of one another, optionally substituted mononuclear or polynuclear aryl or heteroaryl; and m is 1, 2, or 3.

5. An organic semiconductor material, layer, or component comprising the polymer of claim 1.

6. An organic electroluminescent material, layer, or component comprising the polymer of claim 1.

7. An electronic, electroluminescent, or electrooptical device comprising the polymer of claim 1.

8. An electronic, electroluminescent, or electrooptical device comprising a material, layer, or component comprising the polymer of claim 1.

9. The electronic, electroluminescent, or electrooptical device of claim 7, wherein said device is an organic field effect transistor, thin film transistor, integrated circuit, radio frequency identification tag, photodetector, sensor, logic circuit, memory element, capacitor, organic photovoltaic cell, charge injection layer, Schottky diode, planarising layer, antistatic film, conducting substrate or pattern, polymer electrolyte membrane, organic photorefractive device, photoconductor, electrophotographic element, field-quenching device, organic light emitting transistor, organic light emitting diode, or organic laser diode.

10. A process for preparing the polymer of claim 1, comprising coupling one or more monomers based on a unit of formula (I) with one or more monomers based on a unit of formula (II), and optionally with further units, in a polymerisation reaction.

* * * * *